(12) United States Patent
Ossimitz et al.

(10) Patent No.: US 10,090,251 B2
(45) Date of Patent: Oct. 2, 2018

(54) SEMICONDUCTOR CHIP HAVING A DENSE ARRANGEMENT OF CONTACT TERMINALS

(71) Applicant: Infineon Technologies AG, Neubiberg (DE)

(72) Inventors: Peter Ossimitz, Munich (DE); Gottfried Beer, Nittendorf (DE); Juergen Hoegerl, Regensburg (DE); Andreas Munding, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/808,798

(22) Filed: Jul. 24, 2015

(65) Prior Publication Data

US 2017/0025357 A1  Jan. 26, 2017

(51) Int. Cl.
  *H01L 23/538* (2006.01)
  *H01L 23/00* (2006.01)
  *H01L 21/66* (2006.01)

(52) U.S. Cl.
  CPC .......... *H01L 23/5386* (2013.01); *H01L 22/32* (2013.01); *H01L 24/06* (2013.01); *H01L 24/14* (2013.01); *H01L 24/16* (2013.01); *H01L 24/17* (2013.01); *H01L 24/05* (2013.01); *H01L 24/13* (2013.01); *H01L 2224/13082* (2013.01); *H01L 2224/14132* (2013.01); *H01L 2224/14133* (2013.01); *H01L 2224/14142* (2013.01); *H01L 2224/14143* (2013.01);

(Continued)

(58) Field of Classification Search
  CPC ........................... H01L 23/5386; H01L 22/32
  See application file for complete search history.

(56) References Cited

U.S. PATENT DOCUMENTS 5,414,637 A    5/1995  Bertin et al.
5,828,128 A *  10/1998 Higashiguchi .... H01L 23/49816
                                                257/737

(Continued)

FOREIGN PATENT DOCUMENTS

CN         1359538 A    7/2002
CN       101246872 A    8/2008

(Continued)

*Primary Examiner* — Tran Tran
(74) *Attorney, Agent, or Firm* — Murphy, Bilak & Homiller, PLLC

(57) ABSTRACT

A semiconductor chip includes a semiconductor body having an active device region, one or more metallization layers insulated from the semiconductor body and configured to carry one or more of ground, power and signals to the active device region, and a plurality of contact terminals formed in or disposed on an outermost one of the metallization layers and configured to provide external electrical access to the semiconductor chip. A minimum distance between adjacent ones of the contact terminals is defined for the semiconductor chip. One or more groups of adjacent ones of the contact terminals have an electrical or functional commonality and a pitch less than the defined minimum distance. A single shared solder joint can connect two or more of the contact terminals of the semiconductor chip to one or more of contact terminals of a substrate such as a circuit board, an interposer or another semiconductor chip.

13 Claims, 6 Drawing Sheets

(52) U.S. Cl.
CPC ............... *H01L 2224/16057* (2013.01); *H01L 2224/16105* (2013.01); *H01L 2224/16106* (2013.01); *H01L 2224/171* (2013.01); *H01L 2224/17051* (2013.01); *H01L 2224/17106* (2013.01); *H01L 2225/06513* (2013.01)

(56) References Cited

U.S. PATENT DOCUMENTS

| | | |
|---|---|---|
| 6,010,058 A | 1/2000 | Kim et al. |
| 6,037,677 A | 3/2000 | Gottschall et al. |
| 6,578,755 B1 | 6/2003 | Elenius et al. |
| 6,622,905 B2 | 9/2003 | Shier et al. |
| 2002/0104874 A1 | 8/2002 | Byun et al. |
| 2005/0063165 A1 | 3/2005 | Chang et al. |
| 2006/0202347 A1 | 9/2006 | Egawa |
| 2006/0231952 A1 | 10/2006 | Kim et al. |
| 2007/0023910 A1 | 2/2007 | Beddingfield |
| 2008/0029903 A1 | 2/2008 | Lin |
| 2009/0325415 A1 | 12/2009 | Brist et al. |
| 2010/0032843 A1 | 2/2010 | Chen et al. |
| 2010/0060310 A1 | 3/2010 | Laisne et al. |
| 2012/0061821 A1 | 3/2012 | Black et al. |
| 2013/0082374 A1* | 4/2013 | Crisp ..................... H01L 24/19 257/693 |
| 2013/0087366 A1 | 4/2013 | Michael et al. |
| 2013/0127028 A1 | 5/2013 | Morimoto et al. |
| 2014/0151863 A1 | 6/2014 | Kim et al. |
| 2014/0266418 A1 | 9/2014 | Huang et al. |
| 2014/0346678 A1 | 11/2014 | Delacruz |
| 2015/0155209 A1 | 6/2015 | Tang |
| 2016/0329292 A1 | 11/2016 | Marbella |

FOREIGN PATENT DOCUMENTS

| | | |
|---|---|---|
| CN | 102449757 A | 5/2012 |
| CN | 103219310 A | 7/2013 |
| WO | 0224391 A1 | 3/2002 |

* cited by examiner

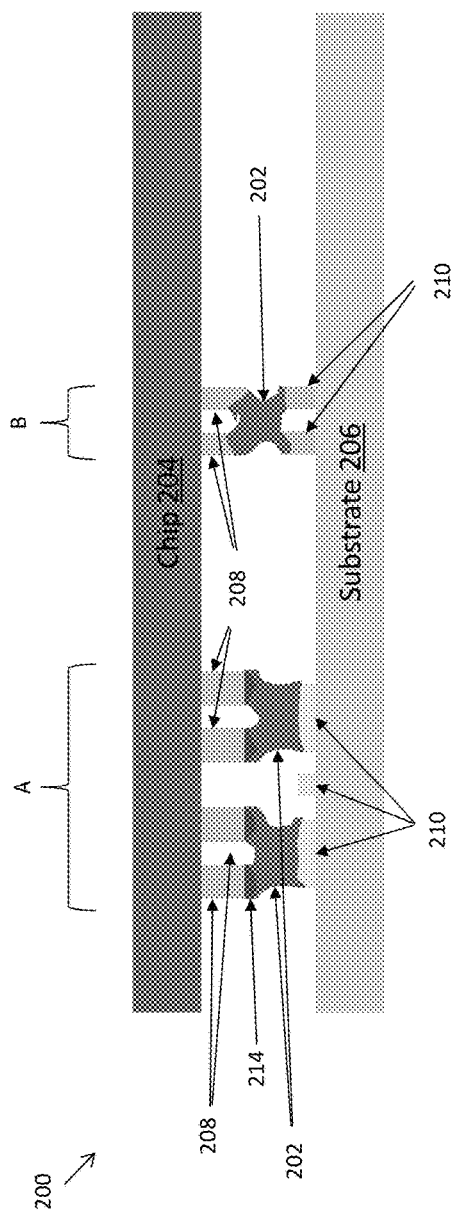
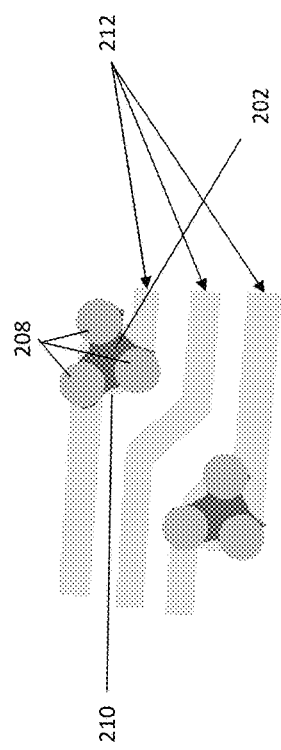
Figure 5A
Figure 5B

SEMICONDUCTOR CHIP HAVING A DENSE ARRANGEMENT OF CONTACT TERMINALS

TECHNICAL FIELD

The instant application relates to semiconductor chips, and more particularly to a dense arrangement of contact terminals for semiconductor chips.

BACKGROUND

Semiconductor chips have contact terminals such as pillars, pads, solder bumps, etc. for providing external electrical access to the chip. Many chip-to-chip and chip-to-board applications have a high contact terminal count. As the number of chip contact terminals increases, the dimensions of the contact terminals should decrease. Otherwise the probability of failure increases. More than one contact terminal can be used for the same signal to address the increased risk of failure. However, if all or even some I/O (input/output) signals are designed with redundancy, chip I/O density increases significantly or the chip size must increase. For a regular orthogonal I/O arrangement, the distance i.e. pitch between adjacent individual interconnects must be reduced by $\sqrt{2}$ in the case of 2× redundancy, by $\sqrt{3}$ in the case of 3× redundancy, etc. in order not to increase chip size. If the pitch is reduced in this way, the liquefiable solder volume also must be reduced. Otherwise the risk of solder shorts between adjacent interconnects increases. However, reducing the liquefiable solder volume increases the risk of contact opens even if chip warpage is very low.

A non-orthogonal chip I/O arrangement such as a hexagonal arrangement can provide a denser I/O arrangement. However, nonuniform I/O arrangements restrict chip and/or substrate metal trace routing. Thermo-compression bonding can be used in the case of extremely small pitches so as to realize very small liquefiable solder volumes. However, thermo-compression bonding is more expensive than normal flip chip processes such as mass reflow with capillary underfill.

In view of the above, there is a need for more reliable and less costly high density semiconductor chip contact terminals.

SUMMARY

According to an embodiment of a semiconductor chip, the semiconductor chip comprises a semiconductor body having an active device region, one or more metallization layers insulated from the semiconductor body and configured to carry one or more of ground, power and signals to the active device region, and a plurality of contact terminals formed in or disposed on an outermost one of the metallization layers and configured to provide external electrical access to the semiconductor chip. A minimum distance between adjacent ones of the contact terminals is defined for the semiconductor chip. One or more groups of adjacent ones of the contact terminals have an electrical or functional commonality and a pitch less than the defined minimum distance.

According to another embodiment of a semiconductor chip, the semiconductor chip comprises a semiconductor body and a plurality of contact terminals spaced apart from the semiconductor body and configured to provide external electrical access to the semiconductor chip. A minimum distance between adjacent ones of the contact terminals is defined for the semiconductor chip. At least some of the contact terminals have an electrical or functional commonality and a pitch which is less than the defined minimum distance.

According to an embodiment of a semiconductor assembly, the semiconductor assembly comprises a substrate having a plurality of contact terminals and a semiconductor chip attached to the substrate. The semiconductor chip comprises a semiconductor body and a plurality of contact terminals spaced apart from the semiconductor body and configured to provide external electrical access to the semiconductor chip. The semiconductor assembly further comprises a plurality of solder joints connecting the contact terminals of the semiconductor chip to the contact terminals of the substrate. At least some of the solder joints individually form a single shared solder joint between two or more of the contact terminals of the semiconductor chip and one or more of the contact terminals of the substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5A illustrates a side perspective view of a semiconductor assembly having shared solder joints between a semiconductor chip and a substrate attached to the chip, according to an embodiment.

FIG. 5B illustrates a top-down plan view of a section of the substrate shown in FIG. 5A.

DETAILED DESCRIPTION

According to semiconductor chip embodiments described herein, a minimum distance between adjacent contact terminals of a semiconductor chip is defined for the chip and at least some of the adjacent contact terminals which have an electrical or functional commonality also have a pitch which is less than the defined minimum distance. Such a pitch configuration increases the contact terminal density of the chip. The adjacent contact terminals which have the reduced (finer) pitch also have an increased risk of failure due to their relatively close proximity e.g. by shorting. However, because these contact terminals have an electrical or functional commonality, the increased failure risk can be mitigated as described in more detail later herein. In general, each group of contact terminals which has an electrical or functional commonality i.e. share one or more electrical and/or functional features or attributes can have a finer pitch than permitted for the semiconductor chip.

According to semiconductor assembly embodiments described herein, a single shared solder joint connects two or more contact terminals of a semiconductor chip to one or more contact terminals of a substrate such as a circuit board, an interposer or another semiconductor chip. The contact terminals of the semiconductor chip which share the same solder joint can have a finer pitch than permitted for the chip as described above, to increase contact terminal density of the chip. Using the same solder joint to connect such closely spaced contact terminals of a semiconductor chip to a substrate increases solder volume which in turn increases reliability. The overall area required to place the chip contact terminals is decreased due to the finer pitch which, resulting in fewer chip-to-substrate connection points and allowing better utilization of lateral connections. Such a shared solder joint configuration for semiconductor assemblies also improves the current capability of the last metal layer of the semiconductor chip for power routing.

Figure 1:
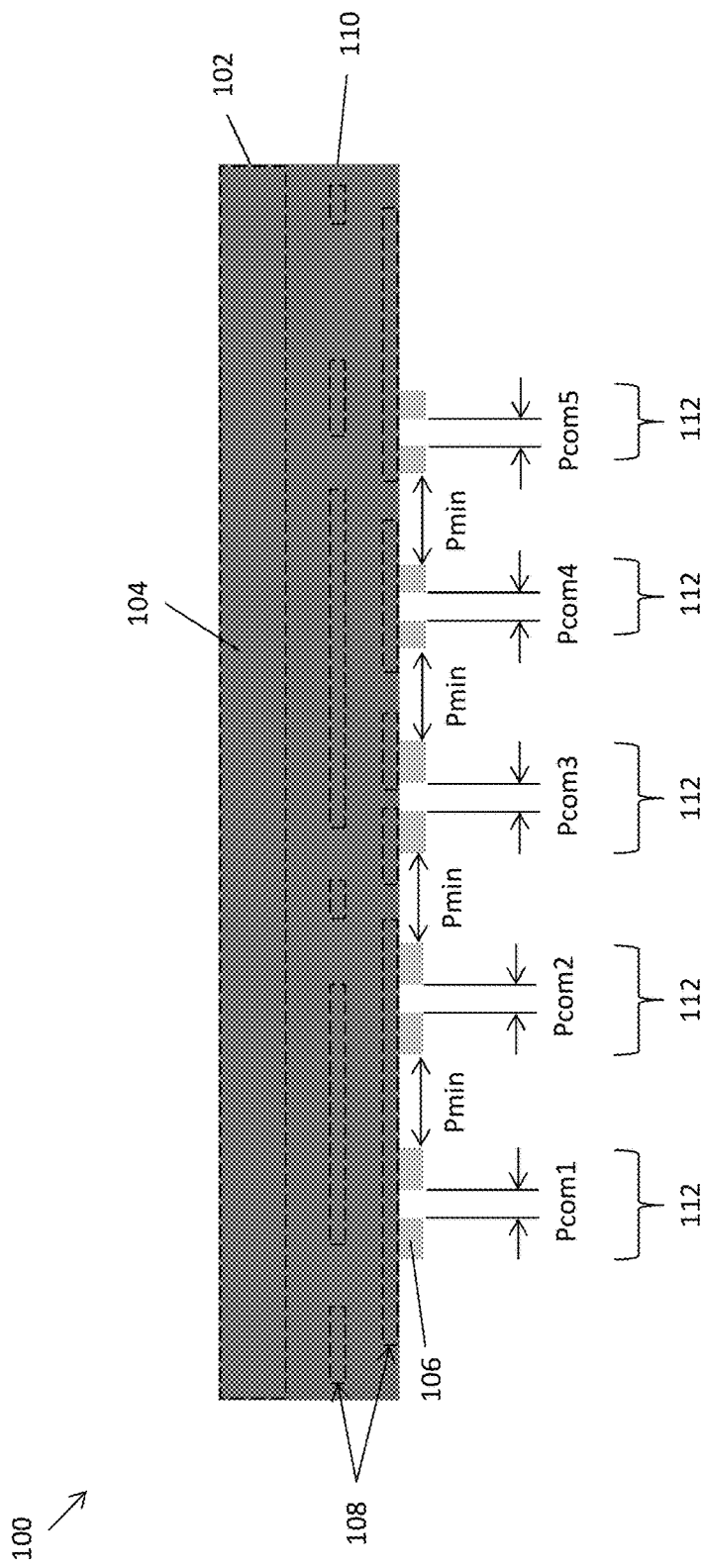
FIG. 1 illustrates a side perspective view of a semiconductor chip having a dense arrangement of contact terminals, according to an embodiment.

FIG. 1 illustrates an embodiment of a semiconductor chip 100 which has a dense arrangement of contact terminals. The semiconductor chip 100 comprises a semiconductor body 102 having an active device region 104. In a broad sense, the semiconductor body 102 can comprise any type of semiconductor material such as mono-crystalline silicon, or any binary, ternary or e.g. quaternary III-V compound semiconductor material. The active device region 104 is the region of the semiconductor chip 100 in which devices such as transistors are formed. These devices form a circuit. The semiconductor chip 100 has contact terminals 106 for enabling the circuit to communicate with the external world. The semiconductor chip 100 also has one or more metallization layers 108 insulated from the semiconductor body 102 by insulating material 110 such as one or more dielectric layers. Each metallization layer 108 is configured to carry one or more of ground, power and signals to the active device region 104 of the chip 100. The active device region 104 and each metallization layer 108 are illustrated with dashed boxes in FIG. 1 because they are out-of-view in this exemplary illustration.

The contact terminals 106 of the semiconductor chip 100 are formed in or disposed on the outermost metallization layer 108. For example, the contacts terminals 106 can be pads, lands, solder bumps, copper pillars, etc. The contact terminals 106 provide the point of physical connection for the semiconductor chip 100 to a substrate (not shown in FIG. 1) such as a circuit board, an interposer, another semiconductor chip, etc. The contact terminals 106 also provide external electrical access to the semiconductor chip 100.

A minimum distance (Pmin) between adjacent ones of the contact terminals 106 is defined for the semiconductor chip 100. This minimum distance can be considered as a design requirement or so-called ground rule in that the minimum defined distance Pmin is not intended to be violated. That is, adjacent ones of the contact terminals 106 should be spaced at a distance of at least Pmin. However, one or more groups 112 of adjacent ones of the contact terminals 106 may have an electrical or functional commonality.

For example in one case of electrical commonality, more than one contact terminal 106 can be used for the same I/O signal. Adjacent contact terminals with such I/O redundancy can be spaced closer together than permitted because failure of one or possibly more of these contact terminals 106 e.g. because of a contact short due to solder bridging does not necessarily result in a faulty I/O signal due to the redundancy. Power and/or ground contact terminals also can have redundancy and therefore a finer pitch than permitted.

In other examples of electrical or functional commonality, two or more adjacent contact terminals 106 can carry different bits of information at the same voltage level or be associated with the same bus in the semiconductor chip 100. The semiconductor chip 100 can be designed to implement any standard error correction scheme such as repetition codes, parity bits, checksums, cyclic redundancy checks (CRCs), cryptographic hash functions, error-correcting codes, etc. in order to correct errors which may occur due to a fault on one or more of these contact terminals. Adjacent contact terminals 106 with such electrical or functional commonality can be spaced closer together than permitted because failure of one or possibly more of these contact terminals does not necessarily result in a signal error due to the error correction scheme used for correcting signal errors.

In general, each group 112 of contact terminals 106 which has an electrical or functional commonality i.e. shares one or more electrical and/or functional features or attributes can have a finer pitch than permitted for the semiconductor chip 100. In some cases, at least two different pitches less than the defined minimum distance can be used for unrelated groups of adjacent contact terminals. For example, the signal contact terminals at the rim or edge of the chip 100 can have denser I/O pitch than ground and power contact terminals in the middle. In addition or alternatively, special interfaces (e.g. XAUII) can have completely irregular terminal arrangements.

FIG. 1 shows five groups 112 of such contact terminals 106, each group 112 having a pitch (Pcom1, Pcom2, Pcom3, Pcom4, Pcom5) which is less than the defined minimum distance Pmin. In one embodiment, the pitch PcomX of the contact terminals 106 in each group 112 is between 90% and 25% of the defined minimum distance Pmin e.g. between 90% and 95%, or between 83% and 89%, or between 75% and 82%, or between 63% and 75%, or between 50% to 62%.

The pitch PcomX for each group 112 of contact terminals 106 which has an electrical or functional commonality can be uniform or nonuniform for different ones of the groups. For example, the pitch for a first one of the groups 112 can be different than the pitch for a second one of the groups 112 e.g. Pcom1≠Pcom2, etc. In the case of nonuniform pitches, the pitch PcomX for each group 112 can be a function of the voltage level permitted for the contact terminals 106 included in that group 112. For example, a group of power contact terminals can have a different pitch than a group of ground contact terminals. Alternatively or in addition, a group of contact terminals which carry one or more signals at a first voltage level can have a different pitch than a group of contact terminals which carry one or more signals at a second voltage level different than the first voltage level. In each case, electrical or functional redundancy implemented in the chip design permits some of the contact terminals 106 to be spaced closer together than otherwise permitted. Described next are different layout embodiments for groups of chip contact terminals which have an electrical or functional commonality.

Figure 2:
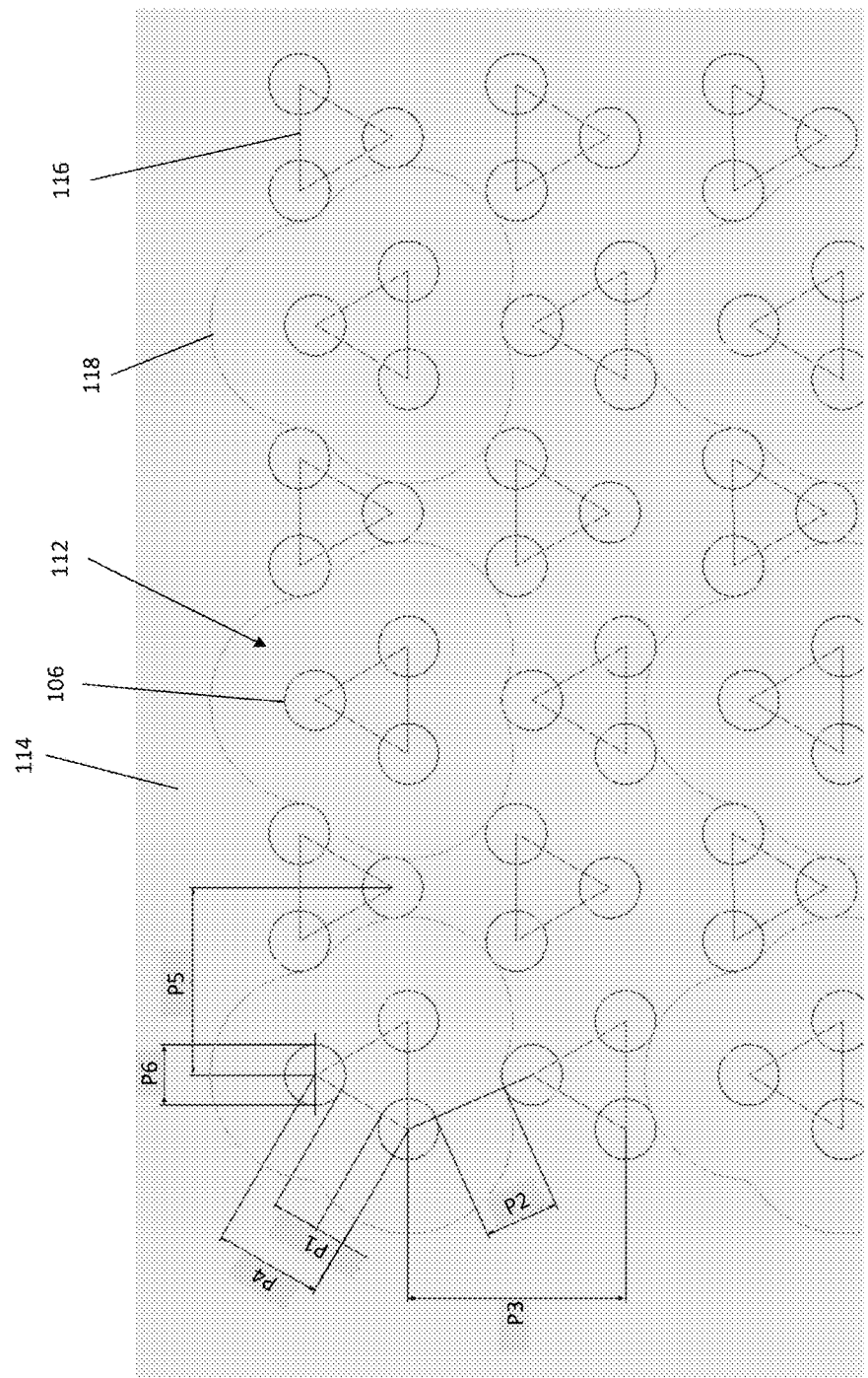
FIG. 2 illustrates a bottom perspective view of a semiconductor chip having a dense arrangement of contact terminals, according to an embodiment.

FIG. 2 is a partial view of part of the allowable contact terminal area 114 of the semiconductor chip 100, according to an embodiment. The allowable contact terminal area 114 is the surface area of the chip 100 available for placement of the contact terminals 106. According to the embodiment shown in FIG. 2, the contact terminals 106 are arranged in groups 112 of three with a regular orthogonal arrangement.

Each group 112 of electrically or functionally related contact terminals 106 forms an even sided triangle with a side length of P4. The area of the each triangle is identified by reference number 116 in FIG. 2. The distance to the closest contact terminal 106 outside of an electrically or functionally related group 112 is labeled P2 in FIG. 2 and corresponds to the minimum contact terminal distance Pmin defined for the chip 100. Each group 112 of three contact terminals 106 having an electrical or functional commonality also has a pitch P1 less than the minimum distance P2 defined for the chip 100. In one embodiment, P1 is about between 90% and 25% of P2. Each group 112 of contact terminals 106 can be arranged in the same approximate manner with the same horizontal pitch P5 and vertical pitch P3 to yield better interconnect density as achieved with a bare hexagonal arrangement.

The total area consumed by all of the contact terminals 106 exceeds 15% of the available contact terminal area 114 according to the embodiment shown in FIG. 2. For example, based on an 80 µm I/O pitch and $p_{i/o}$=0.08 [mm], the area density of contact terminals not belonging to the same group $D_{i/o}$=0.08$^{-2}$~156.3 [mm$^{-2}$] and the area density of the contact terminals in the same group and assuming regular arrangement $D_i$=3×156.3~469 [mm$^{-2}$]. This yields $p_i$=$p_{i/o}$/√3=0.08/√3=0.046 [mm]=46.2 [µm]. In comparison, for a bare hexagonal arrangement the pitch would be 53.3 µm assuming identical I/O density. The amount of contact terminal area needed for placement of each group of contact terminals having an electrical or functional commonality is identified by reference number 118 in FIG. 2.

In general, the larger the contact terminal diameter P6, the less critical the influences of geometrical and process related tolerances on contact terminal opens. The contact terminals 106 need not have a round shape as shown in FIG. 2. Instead, some or all of the contact terminals 106 can have any irregular shape designed to achieve an optimized distance between neighboring contact terminals 106. In addition or alternatively, the contact terminals 106 can have the same diameter or different diameters e.g. 20, 18, 16 µm diameters.

The smaller the distance between the contact terminals 106, the more critical the influence of all tolerances on contact terminal shorts. However, the effect of shorts between contact terminals 106 in the same group 112 i.e. contact terminals 106 with a finer pitch (P1) than permitted (P2) is mitigated due to electrical or functional redundancy as explained above. Contact terminals 106 not belonging to the same group 122 have a pitch P2 which satisfies the minimum spacing requirement Pmin defined for the semiconductor chip 100 so as to reduce the risk of electrical failure due to shorting.

Figure 3:
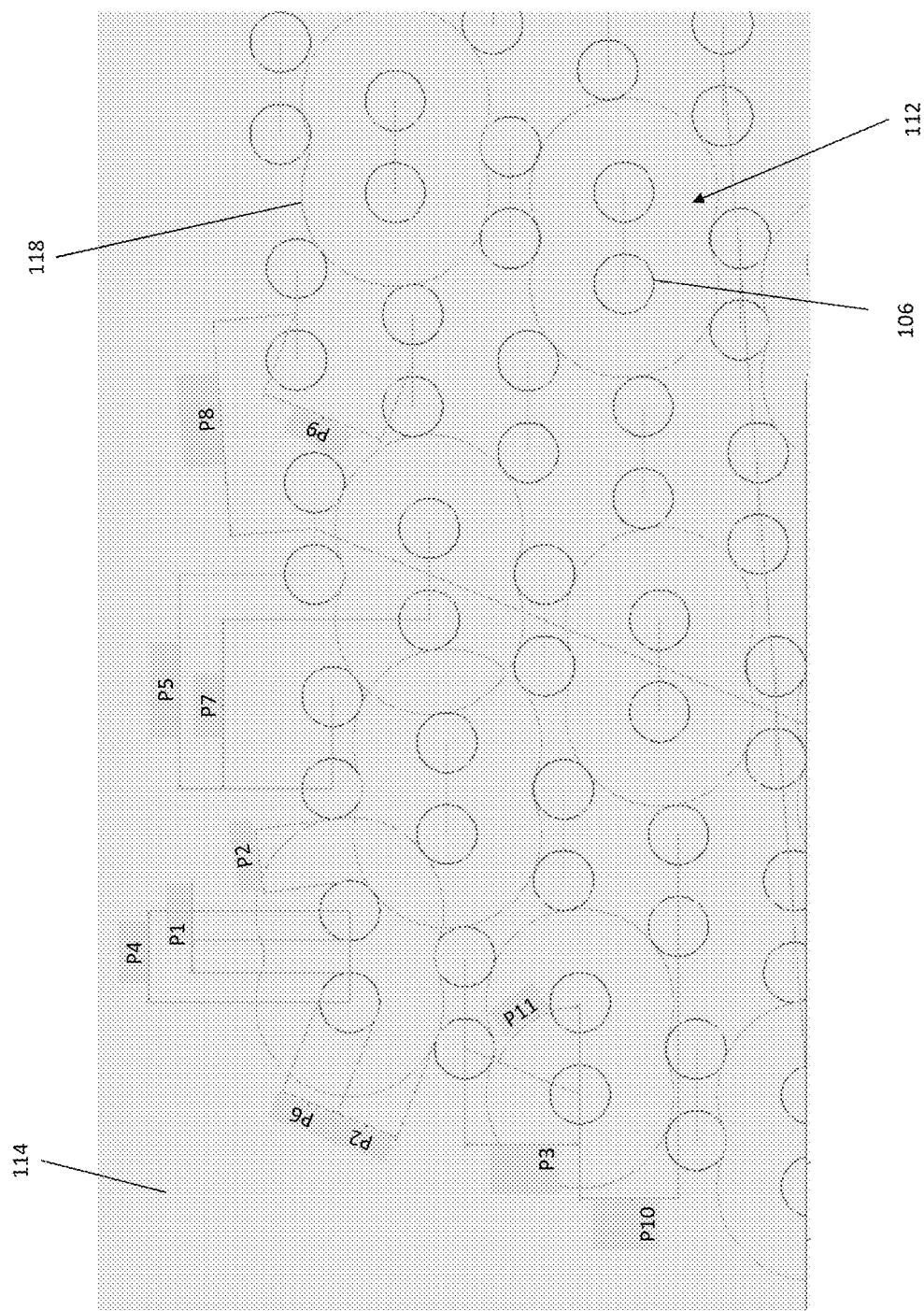
FIG. 3 illustrates a bottom perspective view of a semiconductor chip having a dense arrangement of contact terminals, according to another embodiment.

FIG. 3 is a partial view of the allowable contact terminal area 114 of the semiconductor chip 100, according to another embodiment. The embodiment shown in FIG. 3 is similar to the embodiment shown in FIG. 2. Different however, some of the contact terminals 106 are arranged in groups 112 of two with a regular orthogonal arrangement. Each group 112 of two contact terminals 106 has an electrical or functional commonality and a pitch P1 less than the minimum distance P2 defined for the chip 100. Additional spacing parameters P7-P11 are also shown in FIG. 3. In one embodiment, P1 is about 50% of P2.

The total area consumed by all of the contact terminals 106 can exceed 15% of the available contact terminal area 114 according to the embodiment shown in FIG. 3. For example, based on an 80 µm I/O pitch and $p_{i/o}$=0.08 [mm], the area density of contact terminals not belonging to the same group $D_{i/o}$=0.08$^{-2}$~156.3 [mm$^{-2}$] and the area density of the contact terminals in the same group and assuming regular arrangement $D_i$=2×156.3~313 [mm$^{-2}$]. This yields $p_i$=$p_{i/o}$/√2=0.08/√2=0.057 [mm]=56.6 [µm]. In comparison, for a bare hexagonal arrangement the pitch would be 65.3 µm assuming identical I/O density. In this particular example, the relative difference between each pair of related contact terminals and the adjacent contact terminals not related to that pair is chosen more aggressive according to the relationship of P1/P2=1:2 as compared to the embodiment of FIG. 2. In general, the relationship of P1/P2 is preferably 1:1.1 or larger.

Further, a parallel arrangement of related contact terminals was chosen for the embodiment shown in FIG. 3. Different than the embodiment shown in FIG. 2, not all of the contact terminals 106 belong to a group 112 having an electrical or functional commonality. As such, some of the contact terminals 106 are not spaced at the finer pitch P1. The amount of contact terminal area needed for placement of each group 112 of two contact terminals 106 which have an electrical or functional commonality is identified by reference number 118 in FIG. 3. The horizontal pitch P5 and vertical pitch P3 between adjacent contact terminals in the same group and the closest contact terminal not in that group are also shown in FIG. 3, along with additional spacing contact terminal parameters P7-P11.

Figure 4:
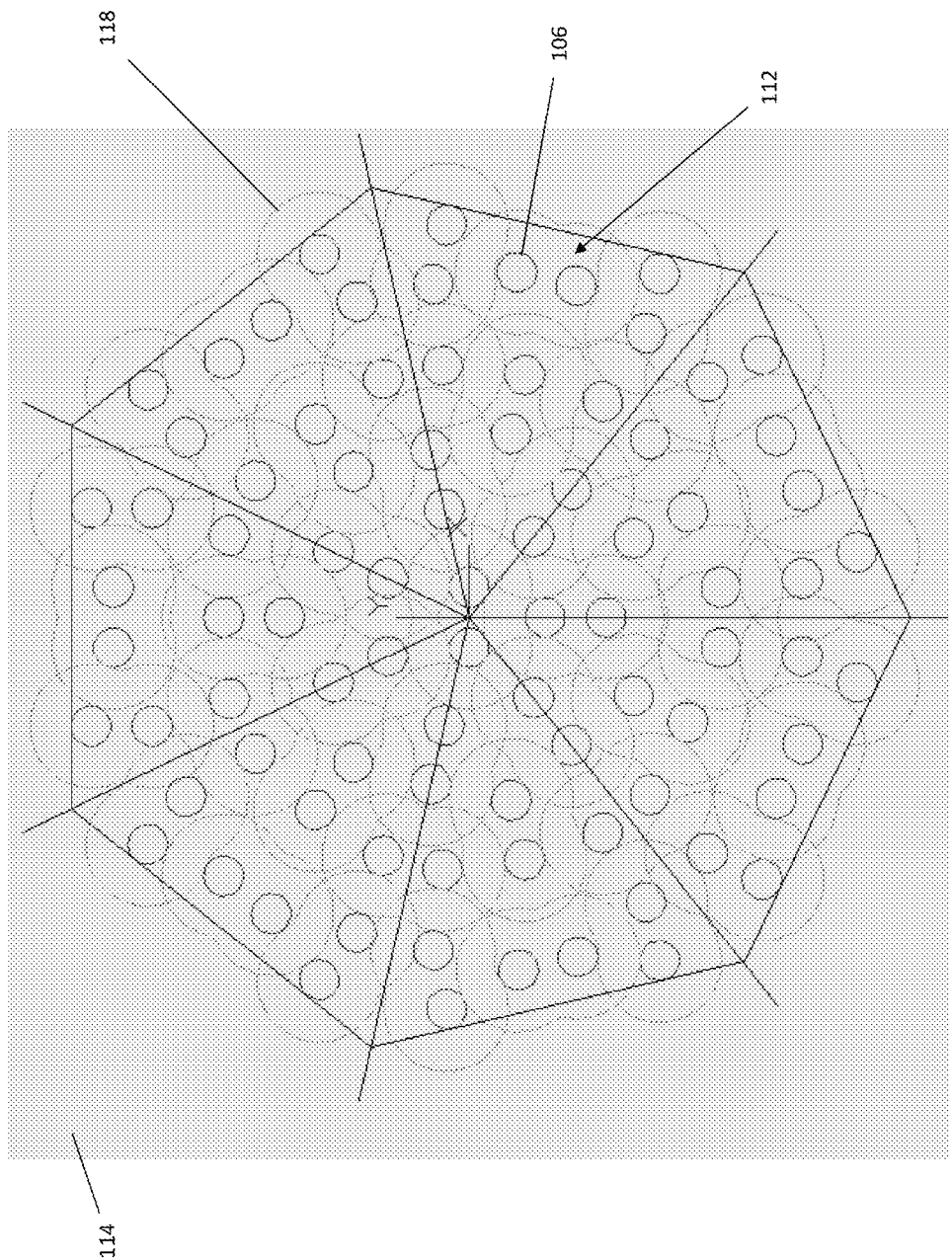
FIG. 4 illustrates a bottom perspective view of a semiconductor chip having a dense arrangement of contact terminals, according to yet another embodiment.

FIG. 4 is a partial view of the allowable contact terminal area 114 of the semiconductor chip 100, according to yet another embodiment. The embodiment shown in FIG. 4 is similar to the embodiment shown in FIG. 3. Different however, the pairs 112 of contact terminals 106 with an electrical or functional commonality have a non-parallel arrangement. The pairs 112 of related contact terminals 106 are generally organized in the form of a star, with tangential filling. In FIG. 4, the pairs 112 of related contact terminals 106 are collectively arranged in the form of a regular 7-sided shape. There is a high portion of overlapping areas between the groups 112 of related contact terminals 106, but these areas of overlap do not intersect with the contact terminals 106. As such, a further increase in I/O density can be achieved with this arrangement.

The example shown in FIG. 4 with a regular 7-sided shape is shown for the purpose of illustrating the many ways in which groups of contact terminals having the same electrical or functional commonality can be arranged. Further degrees of freedom can be realized by using other contact terminal shapes instead of a circular shape. For example, contact terminal shapes with an irregular outline can be used. Also, the contact terminals 106 included in a particular group 112 having any type of electrical or functional commonality which mitigates the increased risk of shorting can be placed closer together than permitted for the chip 100.

For example, the contact terminals 106 in at least one group 106 can provide redundant external signal connections to the semiconductor chip 100 for carrying the same information. A short between two of these contact terminals does not result in signal error. The contact terminals 106 in at least one group 112 can provide redundant power or ground connections to the semiconductor chip 100. Again, a short between two of these contact terminals does not result in signal error. The contact terminals 106 in at least one group 112 can provide test connections to the semiconductor chip 100 which are used only during testing of the chip 100. A short between two of these contact terminals does not result in signal error during chip use since these contact terminals are only used during chip testing. In yet another example, the semiconductor chip 100 includes a bus formed by the metallization layer(s) 108 of the chip 100. The contact terminals 106 in at least one group 112 can provide external signal connections for different lines of the bus. A short between two of these contact terminals does not necessarily result in signal error if an error correction algorithm executed by the chip 100 can correct for such errors. In still another example, the contact terminals 106 in at least one group 112 can provide external signal connections to the semiconductor chip 100 for carrying different bits of information at the same voltage level. A short between two of these contact terminals does not result in signal error if an error correction algorithm executed by the chip 100 corrects for such errors.

The embodiments previously described herein reliably increase the contact terminal density of a semiconductor chip by spacing contact terminals having an electrical or functional commonality closer together than permitted for the chip. Electrical redundancy or error correction techniques mitigate the increased risk of shorting caused by placing related contact terminals in such close proximity. The contact terminal density of a semiconductor chip also can be reliably increased by using shared solder joints as explained in more detail next.

FIGS. 5A and 5B illustrate an embodiment of a semiconductor assembly 200 having shared solder joints 202 between a semiconductor chip 204 and a substrate 206 attached to the chip 204. FIG. 5A shows a side perspective view of the semiconductor assembly 200, and FIG. 5B shows a top-down plan view of a section of the substrate 206 to which the semiconductor chip 204 is attached. The substrate 206 can be a circuit board, an interposer or another semiconductor chip. The semiconductor chip 204 has a semiconductor body and a plurality of contact terminals 208 such as pads, lands, solder bumps, copper pillars, etc. spaced apart from the semiconductor body and configured to provide external electrical access to the semiconductor chip 204 as previously described herein.

The substrate 206 also has a plurality of contact terminals 210 such as pads, lands, solder bumps, copper pillars, etc. Solder joints 202 connect the contact terminals 208 of the semiconductor chip 204 to the contact terminals 210 of the substrate 206. At least some of the solder joints 202 individually form a single shared solder joint between two or more of the chip contact terminals 208 and one or more of the substrate contact terminals 210.

In the example illustrated in FIG. 5B, respective groups of three chip contact terminals 208 are each connected to one substrate contact terminal 210 via a single shared solder joint 202. The substrate 206 has at least one patterned metallization layer 212 for carrying signals, power and ground between other components and the semiconductor chip 204 via the solder joint connections 202.

Any standard solder process can be employed to form the shared solder joints 202. For example, the ends of the chip contact terminals 208 which face the substrate 206 can be coated to enhance wetting on this edge of the chip contact terminals 208. Also, a barrier can be placed between the chip contact terminals 208 and the solder 202 e.g. in the case of copper contact terminals. Alternatively, the barrier can be omitted.

In general, it is the arrangement of the chip contact terminals 208 which brings about the shared solder joint configuration. Enough solder volume is provided to form each shared solder joint 202. In one embodiment illustrated as 'A' in FIG. 5A, the chip and substrate contact terminals 208, 210 are arranged such that two or more of the chip contact terminals 208 are connected to one of the substrate contact terminals 210 by a single shared solder joint 202. In another embodiment illustrated as 'B' in FIG. 5A, two or more of the chip contact terminals 208 are connected to two or more of the substrate contact terminals 210 by a single shared solder joint 202. As the substrate 206 can be also a semiconductor, in a specific embodiment the functionality of chip 204 and substrate 206 according to FIG. 5A can be reversed. The contact area size of the contact terminals 208 shown in the top view of FIG. 5B can be smaller than the contact area size of the substrate contact terminals 210, enabling a better routing and placement capability on the substrate 206.

In some embodiments, each group of two or more contact terminals 208 of the semiconductor chip 204 which are connected to one or more of the contact terminals 210 of the substrate 206 by a single shared solder joint 202 have a total contact area which is between 10% and 70% larger than a contact area on the substrate 206 of the shared solder joints 202. In other words, the chip contact terminals 210 collectively can have a significantly larger contact area than the shared solder joints 202. As such, the shared solder joints 202 can provide a sort of contact area reduction from the chip 204 to the substrate 206.

Robustness of the semiconductor assembly 200 can be increased by applying different design rules for the chip contact terminals 208, each optimized to avoid a different failure mode during operation life cycle. For example, at least some of the chip contact terminals 208 can have surface terminations 214 such as a coating, film, etc. at the end of the contact terminals 208 facing the substrate 206. The surface terminations 214 accommodate stresses between the substrate 206 and the semiconductor chip 204 which arise e.g. due to temperature variations and/or different CTE. According to one embodiment, two or more chip contact terminals 208 connected to one or more of the substrate contact terminals 210 by the same shared solder joint 202 have different surface terminations 214 in order to accommodate different types of stresses such as tensile, compression or shear stress and all other stresses that occur in the assembly life cycle. For example, if one terminal fails due to solder migration, another terminal with a different coating, film, etc. may not be prone to this failure mechanism under the given operating conditions.

In some embodiments, two or more chip contact terminals 208 connected to at least one of the substrate contact terminals 210 by the same shared solder joint 202 has a pitch less than the defined minimum distance Pmin for adjacent ones of the chip contact terminals 208 as previously described herein in connection with FIGS. 1-4. According to these embodiments, the chip contact terminals 208 which share the same solder joint 202 for connection to the substrate 206 have an electrical or functional commonality. For example, chip contact terminals 208 connected to at least one of the substrate contact terminals 210 by the same shared solder joint 202 can provide redundant external signal connections to the semiconductor chip 204 for carrying the same information. In another example, chip contact terminals 208 connected to at least one of the substrate contact terminals 210 by the same shared solder joint 202 can provide redundant power or ground connections to the semiconductor chip 204. In yet another example, chip contact terminals 208 connected to at least one of the substrate contact terminals 210 by the same shared solder joint 202 can provide test connections to the semiconductor chip 204 which are used only during testing of the semiconductor chip 204. In still another example, chip contact terminals 208 connected to at least one of the substrate contact terminals 210 by the same shared solder joint 202 can provide external signal connections for different lines of a bus included in the chip 204. In another example, chip contact terminals 208 connected to at least one of the substrate contact terminals 210 by the same shared solder joint 202 can carry different bits of information at the same voltage level.

Figure 6:
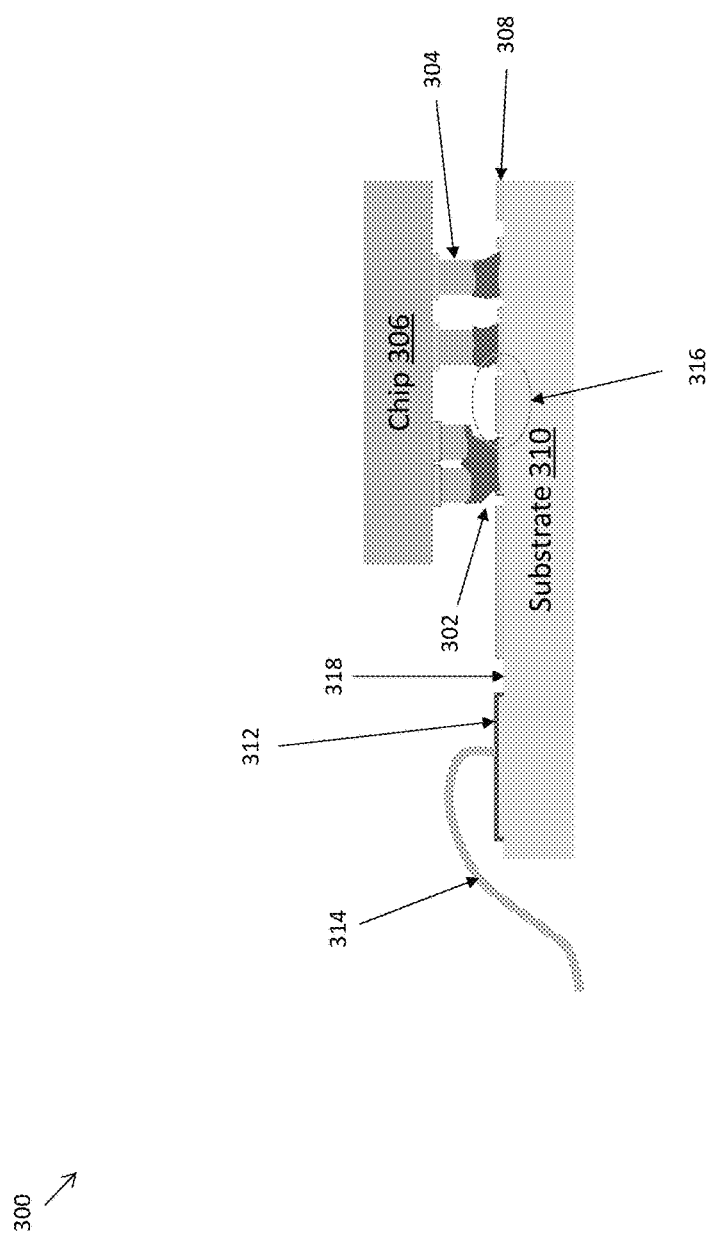
FIG. 6 illustrates a side perspective view of a semiconductor assembly having shared solder joints between a semiconductor chip and a substrate attached to the chip, according to another embodiment.

FIG. 6 illustrates a side perspective view of another embodiment of a semiconductor assembly 300 having shared solder joints 302 between two or more contact terminals 304 of a semiconductor chip 306 and one or more contact terminals 308 of a substrate 310 attached to the chip 306. The embodiment shown in FIG. 6 is similar to the embodiment shown in FIGS. 5A and 5B. According to the embodiment shown in FIG. 6, the substrate 310 is a circuit board which has one or more additional semiconductor chips 312 attached to the board 310. Wire bond or other types of electrical connections 314 can be made to the additional chip 312. Also, FIG. 6 illustrates that additional area 316 is provided on the surface 318 of the circuit board 310 to which the chip 306 is attached due to the use of shared solder joints 302. This in turn provides increased routing area on the circuit board 310 for signals and/or power.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor chip, comprising:
 a semiconductor body having an active device region;
 one or more metallization layers insulated from the semiconductor body and configured to carry one or more of ground, power and signals to the active device region; and
 a plurality of contact terminals formed in or disposed on an outermost one of the metallization layers and configured to provide external electrical access to the semiconductor chip,
 wherein a minimum distance between adjacent ones of the contact terminals is defined for the semiconductor chip, the minimum distance being a design requirement to prevent shorting due to solder bridging between adjacent contact terminals,
 wherein one or more groups of adjacent ones of the contact terminals have an electrical or functional commonality and a pitch less than the defined minimum distance.

2. The semiconductor chip of claim 1, wherein the contact terminals are solder bumps or copper pillars.

3. The semiconductor chip of claim 1, wherein the pitch is between 90% and 25% of the defined minimum distance.

4. The semiconductor chip of claim 3, wherein the pitch is between 50% and 25% of the defined minimum distance.

5. The semiconductor chip of claim 1, wherein the contact terminals in at least one of the groups provide redundant external signal connections to the semiconductor chip for carrying the same information.

6. The semiconductor chip of claim 1, wherein the contact terminals in at least one of the groups provide redundant power or ground connections to the semiconductor chip.

7. The semiconductor chip of claim 1, wherein the contact terminals in at least one of the groups provide test connections to the semiconductor chip which are used only during testing of the semiconductor chip.

8. The semiconductor chip of claim 1, wherein the semiconductor chip includes a bus, and wherein the contact terminals in at least one of the groups provide external signal connections for different lines of the bus.

9. The semiconductor chip of claim 1, wherein the contact terminals in at least one of the groups provide external signal connections to the semiconductor chip for carrying different bits of information at the same voltage level.

10. The semiconductor chip of claim 1, wherein at least one of the pitches is nonuniform and a function of a voltage level permitted for the contact terminals in each group with a nonuniform pitch.

11. The semiconductor chip of claim 1, wherein the semiconductor chip has an allowable contact terminal area for placement of the contact terminals, and wherein a total area consumed by the contact terminals exceeds 15% of the available contact terminal area.

12. A semiconductor chip, comprising:
 a semiconductor body; and
 a plurality of contact terminals spaced apart from the semiconductor body and configured to provide external electrical access to the semiconductor chip,
 wherein a minimum distance between adjacent ones of the contact terminals is defined for the semiconductor chip, the minimum distance being a design requirement to prevent shorting due to solder bridging between adjacent contact terminals,
 wherein at least some of the contact terminals have an electrical or functional commonality and a pitch which is less than the defined minimum distance.

13. The semiconductor chip of claim 1, wherein some of the contact terminals have an irregular shape.

* * * * *